(12) United States Patent
Hartig et al.

(10) Patent No.: US 7,993,496 B2
(45) Date of Patent: Aug. 9, 2011

(54) CYLINDRICAL TARGET WITH OSCILLATING MAGNET FOR MAGNETRON SPUTTERING

(75) Inventors: Klaus Hartig, Avoca, WI (US); Steve E. Smith, Marana, AZ (US); John E. Madocks, Tucson, AZ (US)

(73) Assignees: Cardinal CG Company, Eden Prairie, MN (US); General Plasma, Inc., Tucson, AZ (US)

( * ) Notice: Subject to any disclaimer, the term of this patent is extended or adjusted under 35 U.S.C. 154(b) by 1180 days.

(21) Appl. No.: 11/171,054

(22) Filed: Jun. 30, 2005

(65) Prior Publication Data

US 2006/0000705 A1    Jan. 5, 2006

Related U.S. Application Data

(60) Provisional application No. 60/584,535, filed on Jul. 1, 2004.

(51) Int. Cl.
*C23C 14/00* (2006.01)
(52) U.S. Cl. .......... 204/192.12; 204/298.21; 204/298.22
(58) Field of Classification Search .............. 204/298.19–298.22, 298.2, 192.1, 204/192.12
See application file for complete search history.

(56) References Cited

U.S. PATENT DOCUMENTS

| | | | |
|---|---|---|---|
| 4,221,652 A | 9/1980 | Kuriyama | 204/298 |
| 4,356,073 A | 10/1982 | McKelvey | |
| 4,407,713 A | 10/1983 | Zega | 204/298 |
| 4,444,643 A | 4/1984 | Garrett | |
| 4,525,264 A | 6/1985 | Hoffman | 204/298 |
| 4,714,536 A | 12/1987 | Freeman et al. | 204/298 |
| 4,892,633 A | 1/1990 | Welty | 204/192.12 |
| 5,328,585 A | 7/1994 | Stevenson et al. | |
| 5,364,518 A | 11/1994 | Hartig et al. | 204/298.22 |
| 5,464,518 A | 11/1995 | Sieck et al. | 204/192.12 |
| 6,264,803 B1 | 7/2001 | Morgan et al. | 204/192.12 |
| 6,365,010 B1 | 4/2002 | Hollars | 204/192.12 |
| 6,416,639 B1 | 7/2002 | De Bosscher et al. | |
| 6,436,252 B1 * | 8/2002 | Tzatzov et al. | 204/298.22 |

(Continued)

FOREIGN PATENT DOCUMENTS

JP    197570    11/1984
JP    59197570 A * 11/1984

(Continued)

OTHER PUBLICATIONS

Wright et al., "Design Advances and Applications of the Rotatable Cylindrical Magnetron", *J. Vac. Sci. Technol.* A4(3), May/Jun. 1986, pp. 388-392.
De Bosscher et al., "Advances in Cylindrical Magnetrons", 14th Annual Technical Conference Proceedings, Society of Vacuum Coaters (1999), pp. 156-162.

(Continued)

*Primary Examiner* — Nam X Nguyen
*Assistant Examiner* — John Brayton
(74) *Attorney, Agent, or Firm* — Fredrikson & Byron, PA

(57) ABSTRACT

In some embodiments, the invention includes a cylindrical cathode target assembly for use in sputtering target material onto a substrate that comprises a generally cylindrical target, means for rotating the target about its axis during a sputtering operation, an elongated magnet carried within the target for generation of a plasma-containing magnetic field exterior to but adjacent the target, a framework for supporting the magnet against rotation within the target, and a power train for causing the magnet to oscillate within and axially of the target in a substantially asynchronous manner to promote generally uniform target utilization along its length, as well as its method of use. In some embodiments, the magnet is oscillated in response to rotation of the target.

17 Claims, 11 Drawing Sheets

U.S. PATENT DOCUMENTS 6,488,824 B1    12/2002    Hollars ................... 204/192.22
6,736,948 B2 *    5/2004    Barrett ..................... 204/298.22

FOREIGN PATENT DOCUMENTS

WO          96/21750       7/1996

OTHER PUBLICATIONS

International Preliminary Report on Patentability and Written Opinion, dated Jan. 9, 2007 (6 pages).

* cited by examiner

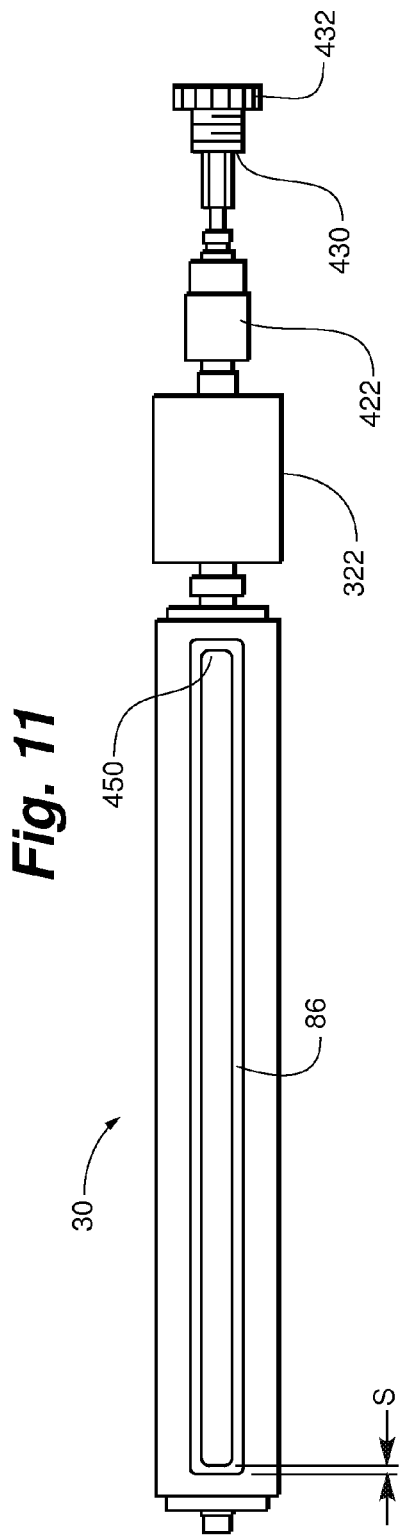

CYLINDRICAL TARGET WITH OSCILLATING MAGNET FOR MAGNETRON SPUTTERING

CROSS REFERENCE TO RELATED APPLICATION

The present application claims priority to provisional U.S. patent application filed Jul. 1, 2004 and assigned Ser. No. 60/584,535, the entire disclosure of which is incorporated herein by reference.

FIELD OF THE INVENTION

The present invention relates to cylindrical targets useful in magnetron sputtering.

BACKGROUND OF THE INVENTION

Magnetron sputtering of various materials onto substrates such as glass panes involves the use of a cathodic target, a magnet to produce a magnetic field adjacent to the target, and an inert gas such as argon which forms a plasma that is contained by the magnetic field. Targets can be of various configurations, but cylindrical targets that rotate about their axes during a sputtering operation are widely used. These targets are usually tubular, and employ a magnet that is positioned within the interior of the target. Although the target rotates about its axis, the magnet commonly does not; rather, the magnet is held in a stationary position as the target rotates.

Unfortunately, it has been found that the targets do not wear uniformly and evenly along their lengths as material is sputtered from the targets' outer surfaces. The erosion that takes place between their end portions similarly is not uniform; although some uniformity of erosion is experienced nearer the center of the target, severe erosion occurs near the target ends.

The result of the uneven erosion pattern is that by the time the target must be replaced due to nearly complete erosion nearer the target ends, the central portion of the target yet retains a substantial amount of sputterable target material. Some improvement in efficiency can be obtained by utilizing dual magnets in which the ends of the magnets are offset from one another. However, better target utilization remains the goal. The replacement of targets from a sputtering apparatus is a considerable job, and of course the sputtering line must be shut down during target replacement.

SUMMARY OF THE INVENTION

It has now been found that the uniformity of the erosion pattern from a cylindrical sputtering target can be improved by causing the magnet within the target to oscillate axially of the target. In some embodiments the motion of the magnet is a function of, and derived from, the rotation of the target, such that the motion of the magnet and the rotation of the target happen simultaneously. In further embodiments, the magnet is oscillated in an asynchronous manner with respect to rotation of the target. In other embodiments, the magnet is movable manually.

Hence, in some embodiments, the invention relates to a cathode target assembly for use in sputtering target material onto a substrate such as glass. The assembly comprises a generally cylindrical target, and means for rotating the target about its axis during a sputtering operation. An elongated magnet is carried within the target for generation of a plasma-containing magnetic field exterior to but adjacent the target. A framework is provided for supporting the magnet against rotation within the target but enabling the magnet to move axially within the target. A power train is provided for causing the magnet to oscillate along its length axially of the target in a substantially asynchronous manner to promote generally uniform target utilization along its length. In some embodiments, the magnet is oscillated in response to rotation of the target.

In certain embodiments, the power train may comprise a cam and a cam follower, one of which is carried by the target and the other by the magnet, with the cam and cam follower being in engagement to drive the magnet axially as the target rotates. For example, the cam may be carried by the target, and the cam follower may be carried by the magnet in position to engage the cam. The cam has a camming surface that varies axially of the target as the target rotates about its axis to thereby cam the cam follower and hence the magnet axially of the target in response to rotation thereof. In a particular embodiment, the cam comprises a generally serpentine pathway about the inner circumference of the target, and the cam follower comprises a surface protruding from the magnet and that engages a surface of the serpentine pathway to move the magnet axially in response to rotation of the target about its axis. In certain embodiments, the target may include an end section adjacent to an open end of the target, the end section bearing a cam that is engagable with a cam follower carried by the magnet. In other embodiments, the magnet framework includes a camming body having a serpentine pathway, the power train serving to axially move the body and magnet in response to rotation of the target. The target, in turn, may include a cam follower that is engaged with the serpentine pathway and that axially drives the magnet and camming body. In further embodiments, axial movement is provided by a cam disk with a camming surface. As the cam disk rotates, the magnet assembly is moved axially by the camming profile. Biasing means, such as a spring, may be used to bias the magnet assembly towards the camming profile. In other embodiments, axial movement may be provided by an actuator that is periodically actuated either manually or by an automated mechanism.

The movement of the magnet with respect to the target is desirably substantially asynchronous; that is, an instantaneous axial position of the magnet with respect to the target at any point in the target's rotation varies as the target is rotated through consecutive 360° revolutions, so that no single rotational position of the target corresponds to any single axial position of the magnet in a repetitive manner that causes significant uneven circumferential wear of the target near its ends. In some embodiments, no single rotational position of the target corresponds to any single axial position of the magnet in any two consecutive revolutions of the target.

BRIEF DESCRIPTION OF THE DRAWINGS

FIG. 11 is a schematic view of the cantilevered rotatable magnetron cathode of FIG. 10.

DETAILED DESCRIPTION OF THE PREFERRED EMBODIMENTS OF THE INVENTION

Figure 1:
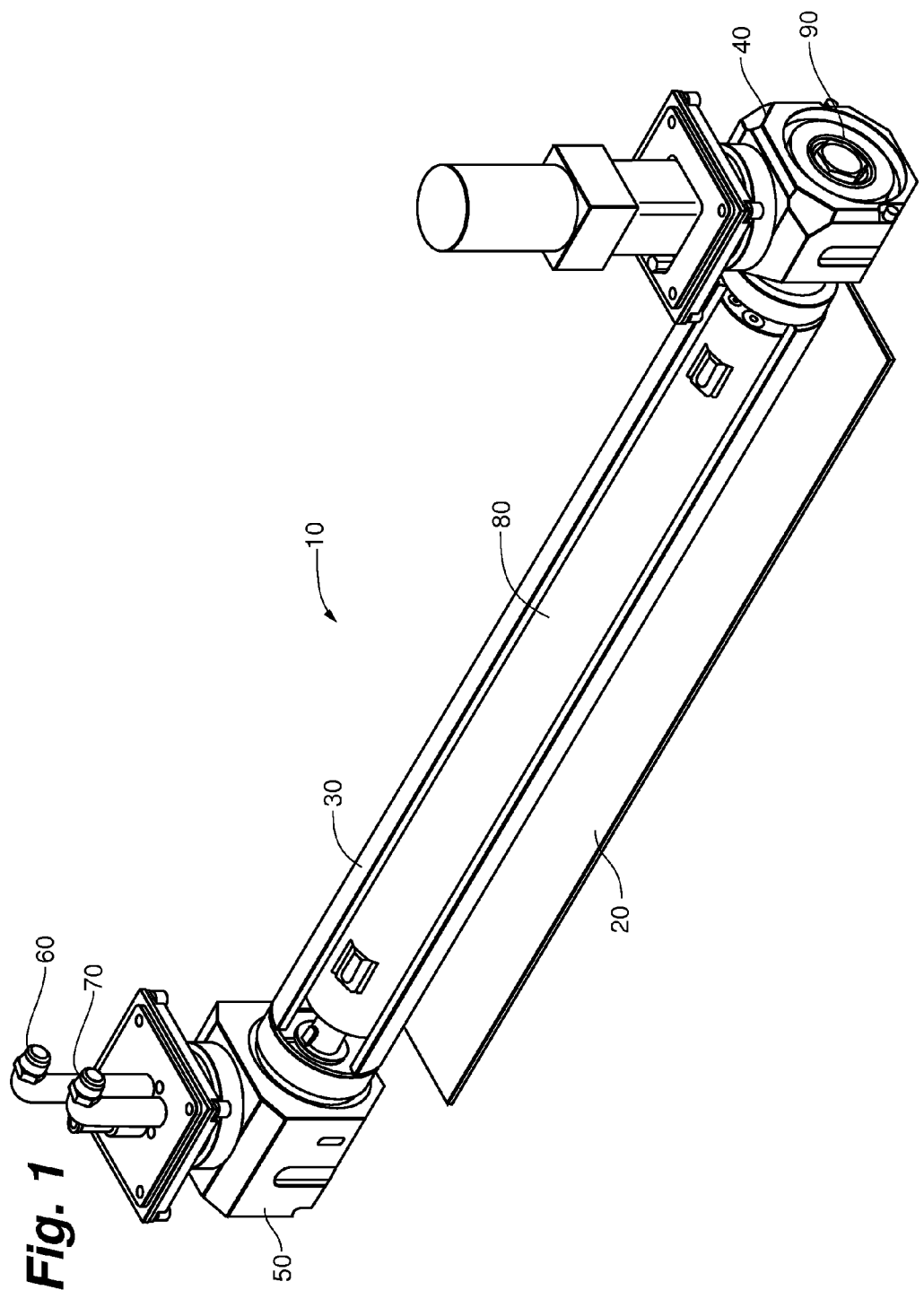
FIG. 1 is a partial cut away three dimensional view of a rotatable magnetron target assembly in accordance with an embodiment of the present invention.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

Figure 2:
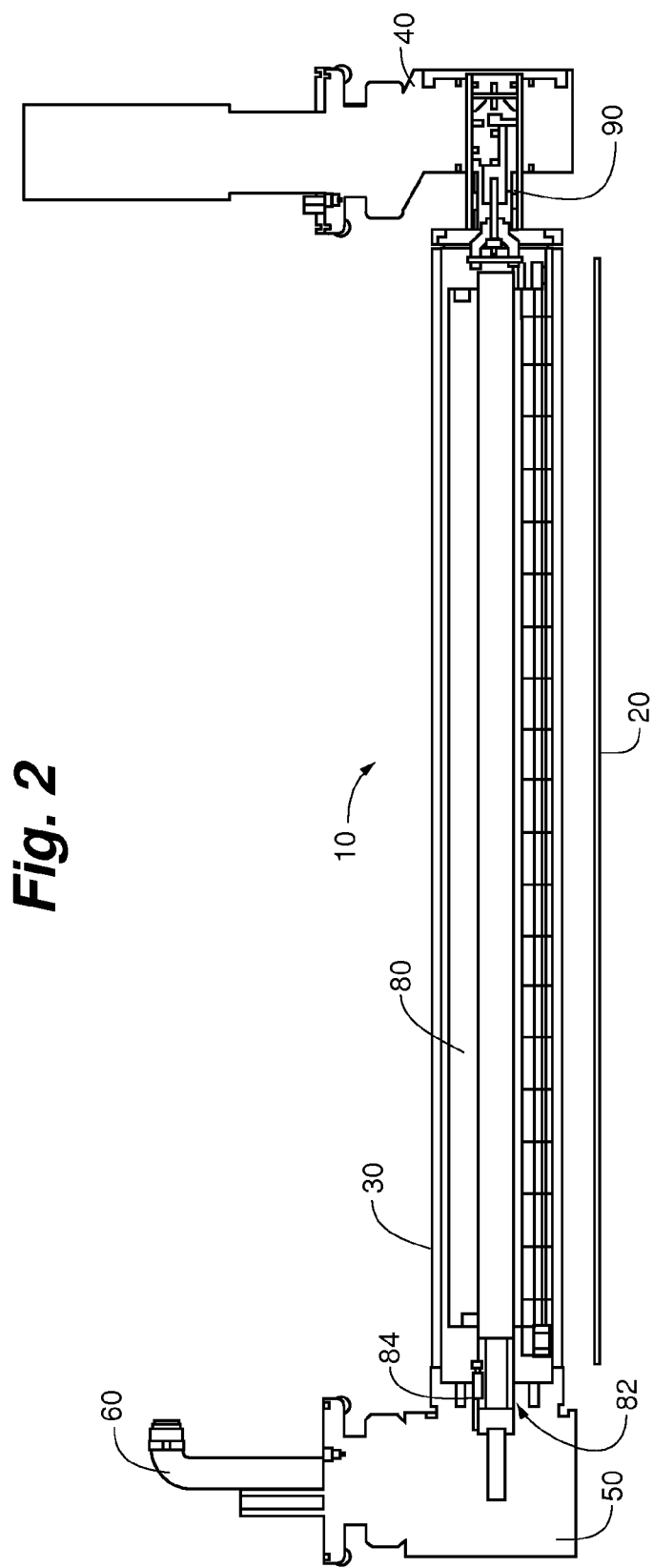
FIG. 2 is a section view of the target assembly of FIG. 1.

FIGS. 1 and 2 show a rotatable target assembly in accordance with an embodiment of the present invention. As shown in FIGS. 1 and 2, the target assembly 10 is useful for coating a substrate 20 with material from a cylindrical target 30 in a sputtering process. Cylindrical target 30 is rotatable about its longitudinal axis commonly by means of an electric motor or other motive device. In some embodiments, the rotating means comprises a drive end block 40 containing a motor useful for rotating cylindrical target 30. Target assembly 10 may be provided with a support end block 50, which is useful for supporting the cylindrical target 30 opposite the drive end block 40. In some embodiments, support end block 50 houses a cooling fluid inlet 60 and a cooling fluid outlet 70. Cooling fluid inlet 60 and cooling fluid outlet 70 are useful for providing cooling water to cylindrical target 30 in order to cool it during the sputtering process. Alternatively, target assembly 10 may be cantilevered, and may not include a support end block 50.

Figure 3:
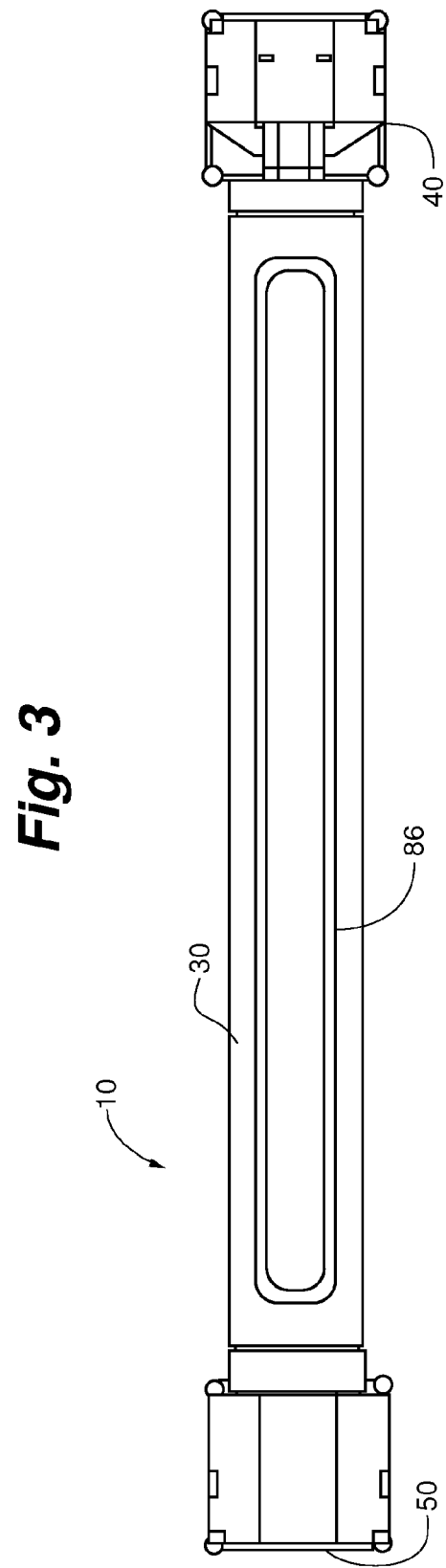
FIG. 3 is a schematic view of the target assembly of FIG. 1.

The target assembly 10 includes at least one elongated magnet assembly 80 carried within the cylindrical target 30 for generation of a plasma-containing magnetic field exterior to but adjacent the target 30, extending longitudinally parallel to the longitudinal axis of the target. The magnet assembly 80 may be disposed within cylindrical target 30. A framework 82 may be provided for supporting the magnet against rotation within the target, such that the framework constrains the magnet and restrains it against rotation. In the embodiment shown in FIG. 2, the framework 82 includes a key 84. The key 84 holds the magnet assembly 80 against rotation while allowing it to move longitudinally. The invention provides for longitudinal oscillation of magnet assembly 80 within cylindrical target 30 to improve target wear patterns 86, as shown in FIG. 3. Desirably, the magnet assembly 80 is axially movable at least one-half centimeter, and more desirably at least one centimeter, such movement being sufficient to substantially even out the wear pattern of a particular target assembly.

Figure 4:
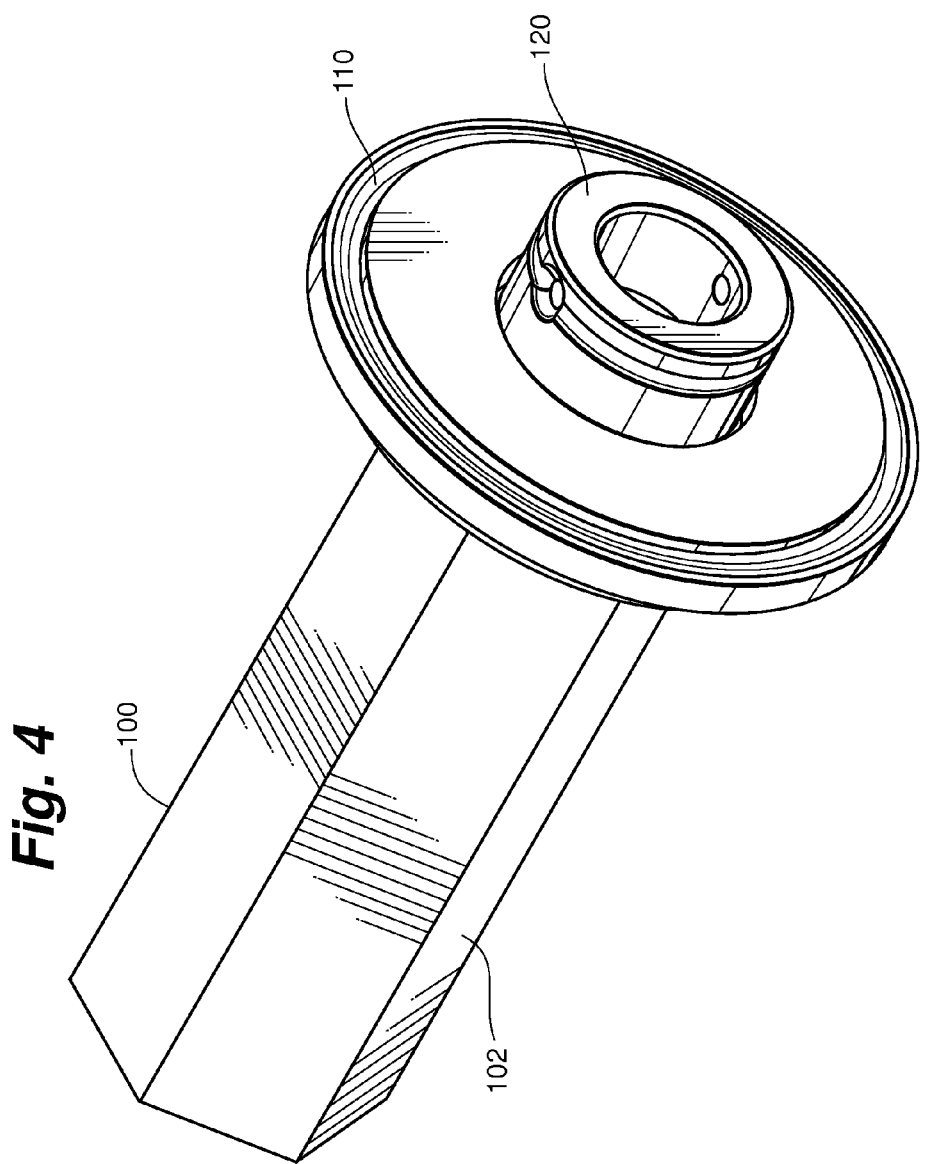
FIG. 4 is a perspective view of a drive casing in accordance with an embodiment of the present invention.
Figure 5:
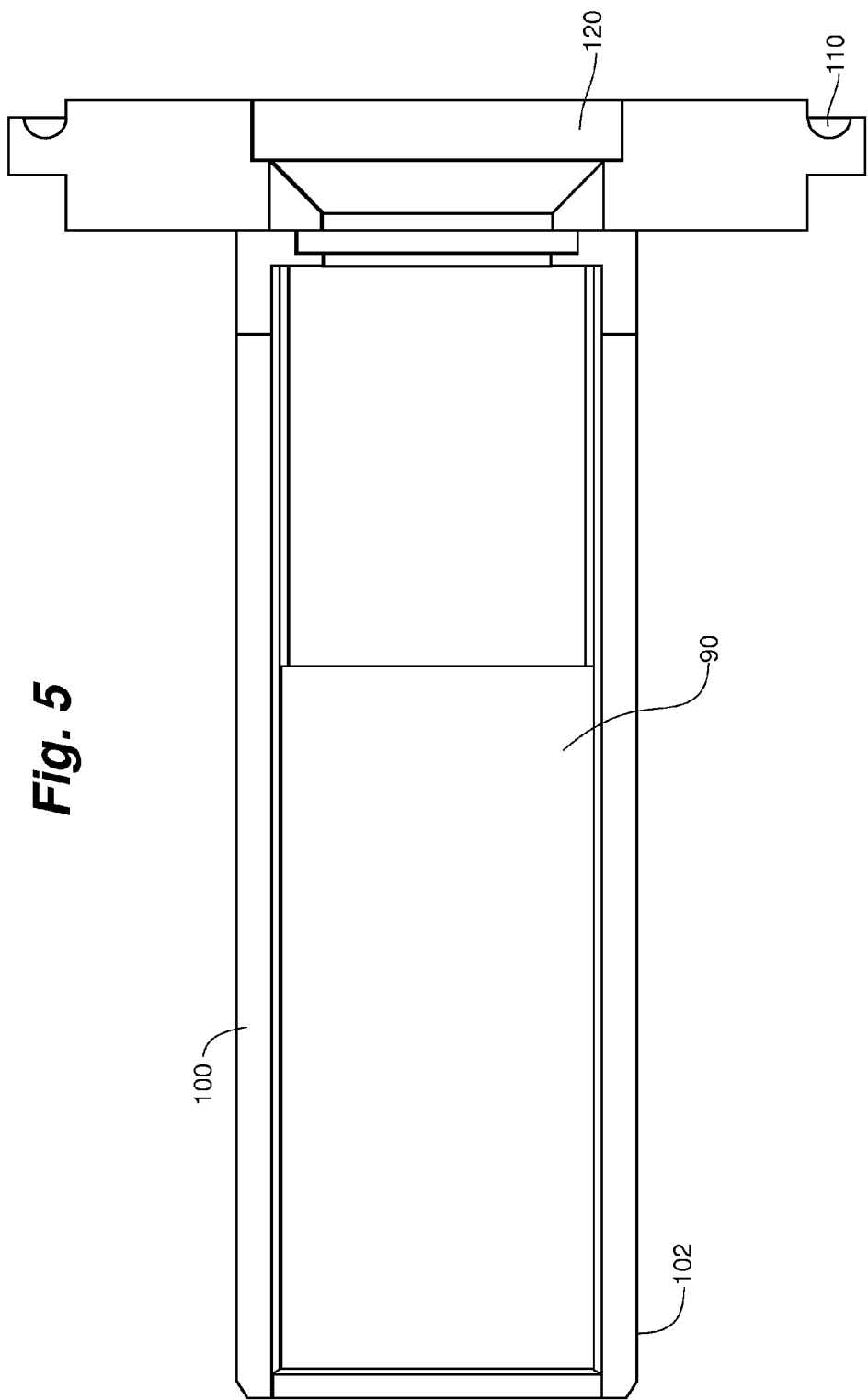
FIG. 5 is a section view of a drive casing and power train in accordance with an embodiment of the present invention.

Longitudinal oscillation of the magnet assembly 80 may be provided in several ways. In some embodiments, longitudinal oscillation of magnet assembly 80 is provided by a power train 90, described further below. Power train 90 may be housed within the target 30, for example, proximate an end section adjacent an end of the target. Alternatively, power train 90 may be housed within a drive casing 100, as shown in FIGS. 4 and 5. Desirably, drive casing 100 is insulated, thereby providing an electrical barrier between the relatively high voltage cylindrical target 30 and the drive end block 40. In some embodiments, drive casing 100 may include a shaft portion 102. Shaft portion 102 may be housed within drive end block 40. In such embodiments, drive end block 40 will impart rotational force to shaft portion 102 to rotate it about its longitudinal axis. Shaft portion 102 may comprise a shape or feature useful for allowing it to accept rotational force from drive end block 40. In the embodiment shown in FIG. 4, for example, shaft portion 102 comprises a hexagonal shape. Shaft portion 102 is useful for transferring the rotational force from drive end block 40 to target drive plate 110. Target drive plate 110 may be formed integrally with shaft portion 102 or may be attached thereto, and is useful for rotating the cylindrical target 30 about its longitudinal axis.

An embodiment of a magnet union 120 is also shown in FIGS. 4 and 5. Magnet union 120 is useful for translating longitudinal motion from the power train 90 to the magnet assembly 80. In the embodiment shown, magnet union 120 extends through an aperture in target drive plate 110. Magnet union 120 generally does not rotate with target drive plate 110. In some embodiments, magnet union 120 is provided with a slip union to reduce rotation forces imparted to magnet assembly 80.

Figure 6:
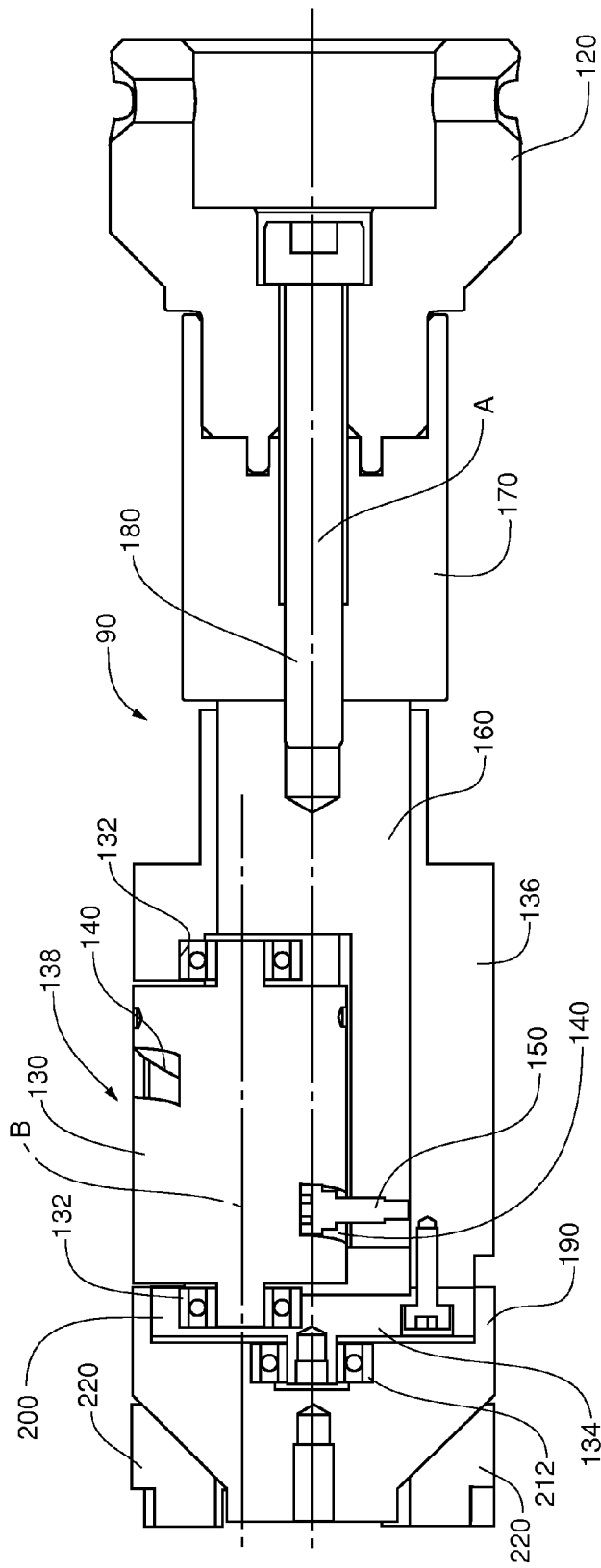
FIG. 6 is a section view of a power train in accordance with an embodiment of the present invention.

FIG. 6 is a section view of a power train 90 in accordance with an embodiment of the present invention. Power train 90 may comprise any structure useful for imparting longitudinal movement to magnet assembly 80. In the embodiment shown in FIG. 6, power train 90 comprises a cam 130 having a generally cylindrical shape and adapted to rotate about its longitudinal axis on cam bearings 132. Cam 130 may be supported on one end by an end plate 134, which is useful for supporting at least one cam bearing 132. The other end of cam 130 may be supported by a linear motion casing 136. Linear motion casing 136 may be held against rotation. As such, cam 130 may rotate about a different axis than cylindrical target 30. Further, cam 130 may rotate about a different rate than cylindrical target 30. For example, cam 130 may be said to rotate at a first rotational rate or speed and target 30 may be said to rotate at a different second rotational rate or speed. Further cam 130 may rotate about its own axis while being held stationery relative to the axis about which drive casing 100 rotates. As shown in FIG. 6, the cylindrical target 30 may rotate about axis A (which may be referred to as its longitudinal axis), and cam 130 may rotate about axis B (which may be referred to as a second axis). In FIG. 6, the first and second axes are shown parallel and displaced from each other.

Cam 130, which may be generally cylindrical in shape, may be provided with a camming surface 138. Surface 138 may comprise any structure or shape useful for linear oscillation of magnet assembly 80. In the embodiment shown in FIG. 6, camming surface 138 includes a generally serpentine pathway 140. Generally serpentine pathway 140 may be a groove or notch along the outer surface of cam 130. The serpentine pathway may take any path along cam 130's surface, but desirably meets itself to form a continuous pathway, thereby creating reciprocating motion of the magnet.

Power train 90 may include a cam follower 150 useful for engaging cam 130. Cam follower 150 may be fixed against rotational movement but free to move longitudinally. Cam follower 150 is useful for following the serpentine groove 140 as cam 130 rotates, moving longitudinally in response to the rotational movement of the cam 130 about its axis. As described below, magnet assembly 80 is functionally coupled to cam follower 150 in such a way that as cam follower 150 moves in response to rotation of cam 130, the magnet assembly 80 is moved longitudinally within and relative to the cylindrical target 30.

Cam follower 150 and magnet assembly 80 may be functionally connected in a variety of ways. In some embodiments, cam follower 150 is rigidly coupled to linear motion shaft 160, which may be of a rectangular profile to hold linear motion casing 136 from rotational movement with respect to the cylindrical target 30. Linear motion shaft 160 may be supported at least in part by linear motion casing 136, and linear motion casing 136 may be adapted to allow linear motion shaft 160 to linearly translate within it.

Linear motion shaft 160 may be coupled to magnet union 120. Alternatively, linear motion shaft 160 may be coupled to a linear motion union 170, which in turn may be coupled to magnet union 120. These parts may be lubricated to assist their longitudinal translation. In the embodiment shown in FIG. 6, linear motion shaft 160, linear motion union 170, and magnet union 120 are coupled together via linear motion assembly bolt 180. Therefore, as cam 130 rotates, cam follower 150 in contact with serpentine groove 140 is translated longitudinally. Cam follower 150 imparts the longitudinal movement to magnet assembly 80 via linear motion shaft 160, linear motion union 170 and magnet union 120, which move together as an assembly when they are coupled together by linear motion assembly bolt 180. Magnet assembly 80 is thereby oscillated about its longitudinal axis according to the shape of the serpentine groove 140.

Figure 7:
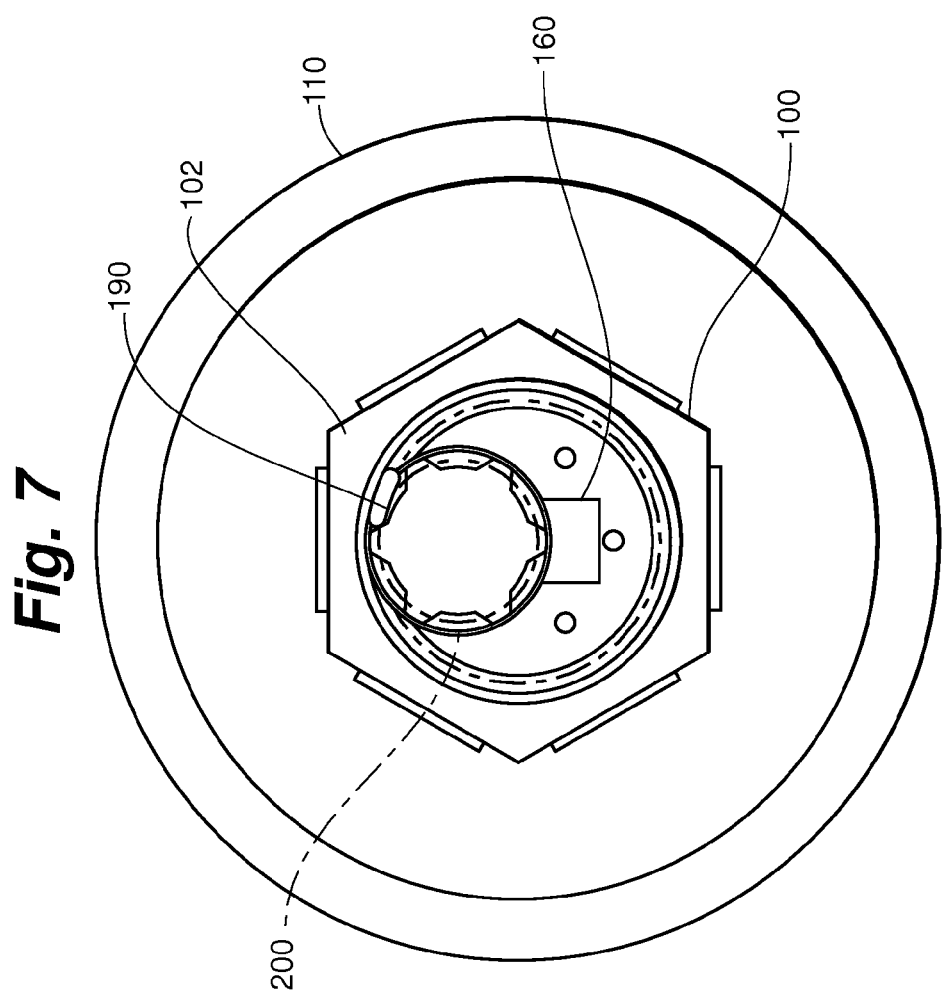
FIG. 7 is an end section view of the power train of FIG. 6.

Rotation may be imparted to cam 130 in a variety of ways. In the embodiment shown in FIGS. 6 and 7, rotation is imparted to cam 130 via drive pin 190 and sprocket 200. Drive pin 190, which may be operatively connected to the rotating target 30, may thus rotate at the same rate as cylindrical target 30 and is positioned to contact a tooth of sprocket 200 once per target revolution, as shown in FIG. 7. Cam 130 rotates with sprocket 200. Sprocket 200 may be coupled to cam 130, or it may be integrally formed therewith. In the embodiment shown in FIG. 7, sprocket 200 has six teeth. Therefore, in this embodiment, cam 130 will rotate through one complete revolution with every six revolutions of drive pin 190, thereby returning magnet assembly 80 to its original position once every revolution of cam 130 and once every six revolutions of cylindrical target 30. Of course, a greater or lesser number of teeth or more than one drive pin may be provided without departing from the scope of the invention.

In such embodiments of the invention, the movement of the magnet assembly 80 with respect to the cylindrical target 30 is substantially asynchronous. That is, an instantaneous axial position of the magnet assembly 80 with respect to the target 30 at any point in the target's 30 rotation varies as the target 30 is rotated through consecutive 360° revolutions, so that no single axial position of the magnet assembly 80 corresponds to any single axial position of the target 30 in a repetitive manner that causes significant uneven wear of the target circumferentially near its ends. Thus, in some embodiments, the magnet moves from one axial position to another in successive rotations of the target, or in successive multiple rotations; e.g., the magnet may move axially after each two or three target revolutions. Of course, the magnet need not move an identical distance each time it moves in response to rotation of the target. In other embodiments, the target may move axially continuously as the target rotates.

Figure 8:
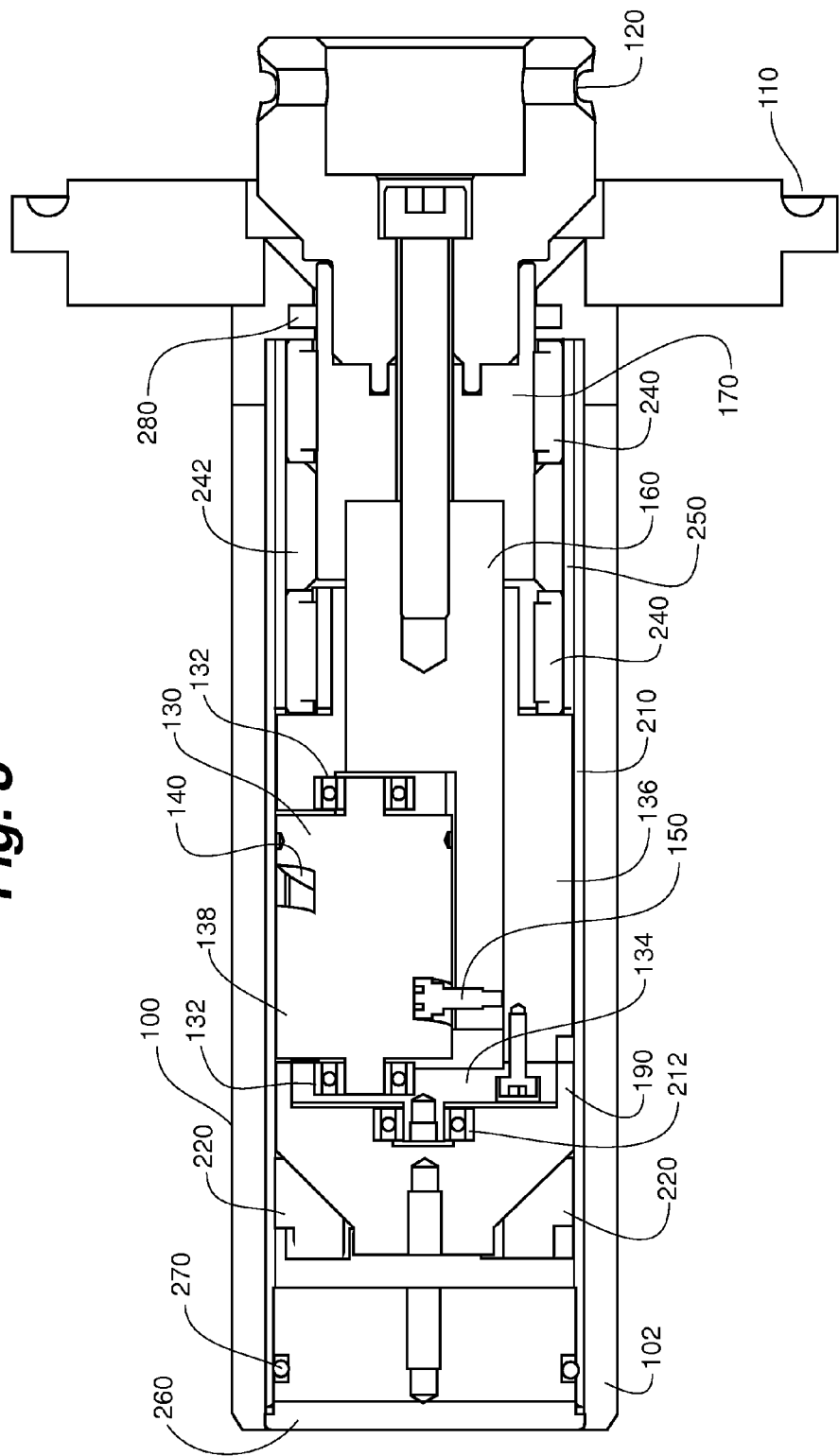
FIG. 8 is a section view of the power train of FIG. 6.

Drive pin 190 may be rotated by or with drive casing 100, as shown in FIG. 8. In some embodiments, drive pin 190 may be rotated about a drive pin bearing 212, which may be supported by end plate 134. A drive clamp 220 may be provided to couple the drive pin 190 to the drive casing 100. In some embodiments, an assembly tube 210 may be coupled to the inner surface of drive casing 100. For example, assembly tube 210 may be welded to this surface. In such embodiments, the drive pin 190 may be clamped to the assembly tube 210 with clamp 220.

Figure 9:
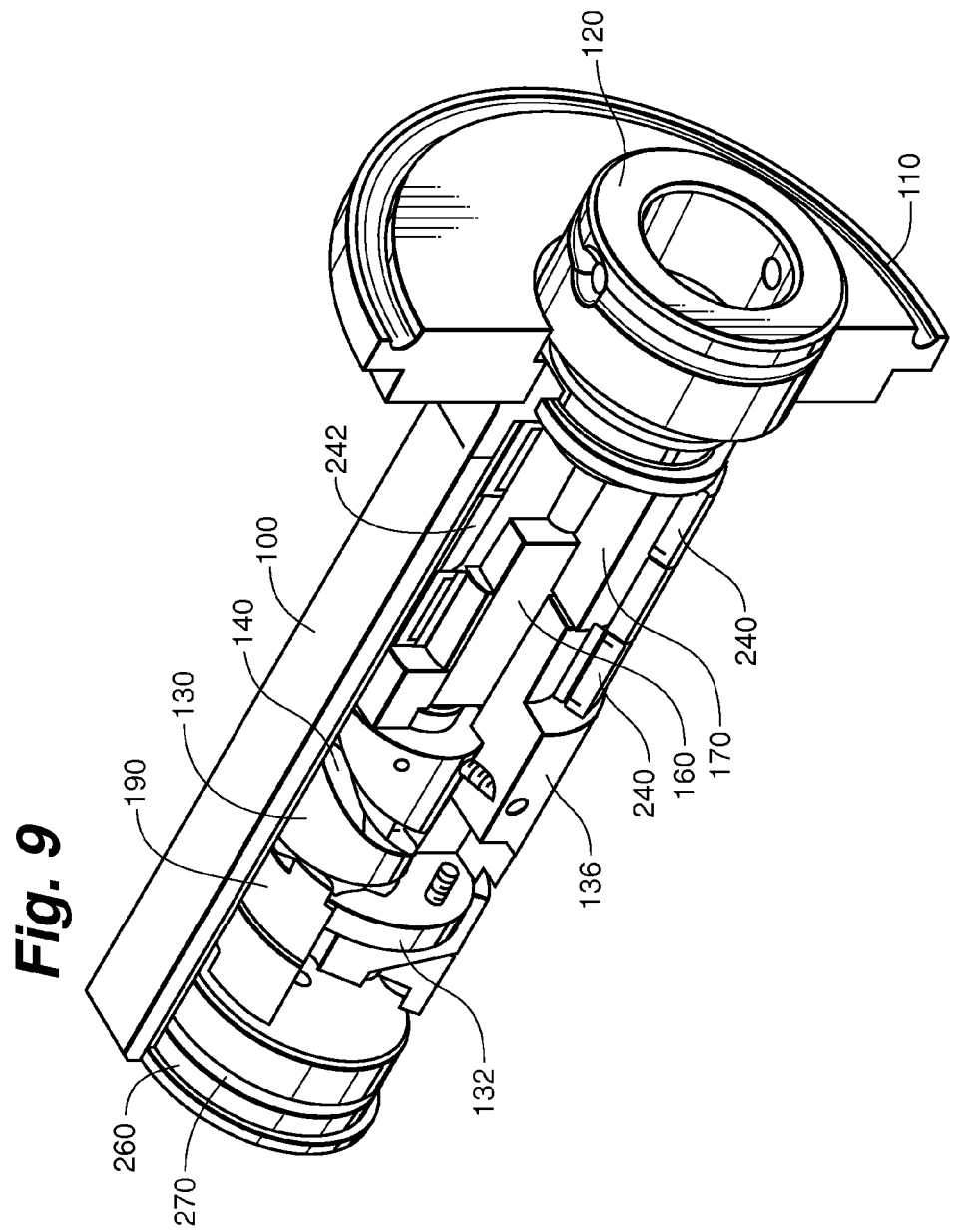
FIG. 9 is a partially cut away perspective view of the power train of FIG. 6.

The power train 90 may be supported against the drive casing 100 with at least one power train support bearing 240. Power train support bearings 240 are useful for allowing drive casing 100 to rotate about power train 90 while power train 90 is held against rotation. In the embodiment shown in FIGS. 8 and 9, a first power train support bearing 240 is provided adjacent to linear motion casing 136, and a second power train support bearing 240 is provided adjacent to linear motion union 170. In embodiments wherein more than one power train support bearing 240 is provided, a bearing spacer 242 may be provided to separate, space, and/or longitudinally support the bearings 240. The bearing spacer 242 may also be useful for determining the depth of the power train 90 within the drive casing 100, which in turn influences the depth of the magnet assembly 80 within the rotary target 30. The outer surface of power train support bearings 240 may be supported by assembly tube 210. In some embodiments, the outer surface of power train support bearings 240 is supported by bearing shim 250, which is coupled to assembly tube 210, by, for example, welding.

Power train 90 may be substantially separated from the cylindrical target 30 and/or the vacuum chamber in which it is utilized. Such separation may be desirable, for example, for reducing the presence of contaminants within drive casing 100, operating the power train 90 at a different pressure than the pressure provided within the vacuum chamber, and/or preventing cooling water from contacting the power train 90. In order to separate power train 90 from the vacuum chamber, an end cap 260 may be provided to cap the end of shaft portion 102 of drive casing 100. Further, an end cap seal 270, such as an o-ring, may be provided around the outer surface of end cap 260 to facilitate the seal. Power train 90 may be separated from cylindrical target 30 proximate the target drive plate 110 end of drive casing 100 by seal 280. Seal 280 may use linear motion union 170 as a sealing surface. Seal 280 is useful for preventing cooling water from entering the drive casing 100 and contacting the power train 90.

In use, for the embodiments shown in FIGS. 1-9, drive end block 40 provides rotational force to drive casing 100. Drive casing 100 rotates drive pin 190 as it rotates cylindrical target 30 about its longitudinal axis via target drive plate 110. Within drive casing 100, power train 90 is held from rotation. As drive pin 190 rotates, it contacts sprocket 200 which is coupled to cam 130. Cam follower 150 moves linearly in response to the profile of serpentine groove 140 within cam 130, and thereby moves linear motion shaft 160, linear motion union 170, and magnet union 120 according to the profile of the serpentine groove 140. Magnet union 120 is coupled to magnet assembly 80, and magnet assembly 80 is thereby linearly oscillated within cylindrical target 30 according to the profile of serpentine groove 140. Therefore, the rotational force used to rotate cylindrical target 30 about its longitudinal axis is used to linearly oscillate, but not rotate, magnet assembly 80 within cylindrical target 30. In such embodiments, magnet assembly 80 is oscillated asynchronously from cylindrical target 30.

As thus described, and depending on the rotational rate of the cylindrical target 30, magnet assembly 80 may oscillate in discrete intervals. That is, one connection between drive pin 190 and sprocket 200 will move the cam 130, and therefore the magnet assembly 80, a discrete distance. A perceptible time interval may take place before a subsequent connection between drive pin 190 and sprocket 200 occurs, thereby creating a perceptible time interval before magnet assembly 80 is moved another discrete distance.

Figure 10:
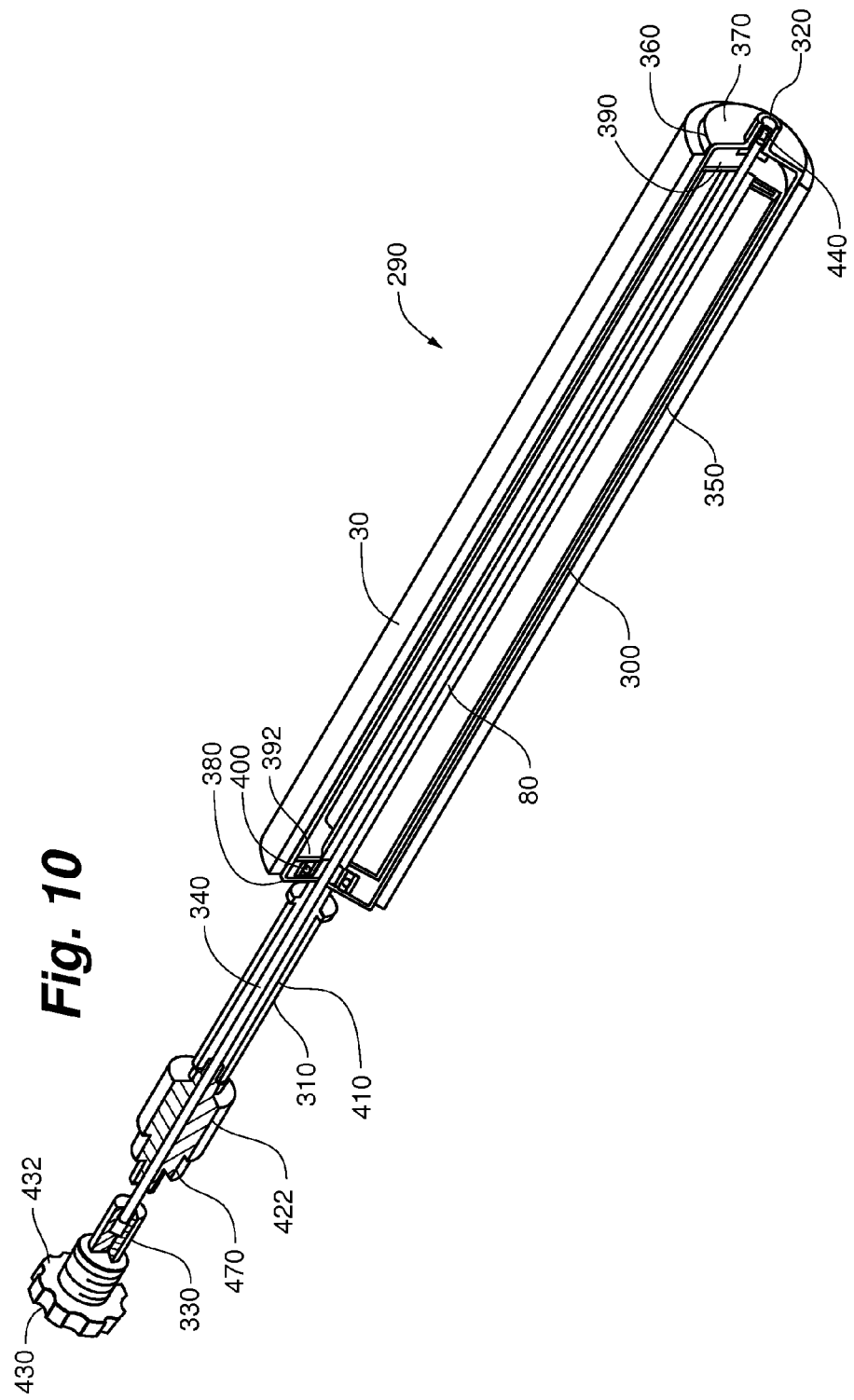
FIG. 10 is a perspective view of a cantilevered rotatable magnetron cathode in accordance with an embodiment of the present invention.

FIGS. 10 and 11 show an embodiment of the present invention that includes a rotary target assembly 290. In the embodiment shown in FIGS. 10 and 11, target assembly 290 is cantilevered. Note that certain details of the assembly are not shown so as to present a better view of the mechanism. Generally, in some embodiments, a rotary target assembly 290 may include a target liner tube 300 useful for carrying a target liner material supported over a substrate (not shown) by bearings (not shown) at first bearing surface 310 and second bearing surface 320. In the embodiment shown in FIG. 10, the target liner tube 300 is supported by a bearing at second bearing surface 320 to reduce the overhung load on the bearing at first bearing surface 310. In other embodiments of rotary target assembly 290, a bearing at second bearing surface 320 is not included. As can be seen in FIG. 11, first bearing surface 320 may be housed in a housing 322. Housing 322 may also house various components of the rotary target assembly 290, such as vacuum sealing, electrical commutation, and cylindrical target 30 rotation means.

Rotary target assembly 290 may also be provided with a cooling water system. In such a system, cooling water may enter the rotary target assembly 290 at entrance port 330 and travel through inner tube 340 and exit into cavity 350 at opening 360. Cavity 350 may be bounded by target liner tube 300, a first end cap 370, a second end cap 380, and a magnet assembly 80. Magnet assembly 80 may be sealed from cavity 350, and hence prevented from contacting the cooling water, by providing a first magnet end cap 390 and second magnet end cap 392. Water flowing out of opening 360 fills cavity 350 and cools target liner tube 300 and cylindrical target 30. Cooling water then exits cavity 350 through magnet bearing 400, flows through tube 410 and exits through exit port 420. A rotary water coupling 422 may also be provided to house or define exit port 420. Embodiments of the rotary water coupling 422 shown in FIGS. 10 and 11 allow tube 410 to empty into it and inner tube 340 to pass through it.

Inner tube 340 may provide a variety of functions. For example, magnet assembly 80 may be held from rotating inside cylindrical target 30 by inner tube 340. In addition, inner tube 340 may be useful for positioning the magnet assembly 80 within the cylindrical target 30. In some embodiments a power train, such as an actuator 430, is included to facilitate the positioning of the magnet assembly 80 within the cylindrical target 30. Actuator 430 may include any structure useful for positioning and/or repositioning the magnet assembly 80 linearly along its longitudinal axis, and may be actuated manually by an operator or by automated means. Desirably, actuator 430 is useful for moving magnet assembly 80 within target 30 in a substantially asynchronous manner. In the embodiment shown in FIG. 10, actuator 430 comprises a knob 432. In some embodiments, knob 432 is at least partially constructed out of a dielectric material such as, for example, polyethylene. Further, voltage protective shielding may be provided as needed to make knob 432 suitable for manual manipulation during the sputtering process. For example, voltage protective shielding may be provided around housing 322, rotary coupling 422, and inner tube 340.

Magnet assembly 80 may be supported inside cylindrical target 30 by magnet bearings 400 and 440. These bearings are useful for keeping the magnet assembly 80 in radial alignment with cylindrical target 30. Desirably, magnet bearings 400 and 440 also allow magnet assembly 80 to move longitudinally along the axis of the cylindrical target 30. Therefore, by manually manipulating knob 432, the inner tube 340 can be moved linearly to change the location of magnet assembly 80 inside cylindrical target 30.

Desirably, magnet assembly 80 may be axially moved relative to the cylindrical target 30 as much as desirable to increase utilization of cylindrical target 30. For example, the turnaround location may be moved a distance 'S' as shown. Desirably, magnet assembly 80 is axially movable within cylindrical target 30 at least one-half centimeter, and perhaps more desirably at least one centimeter.

In operation of some embodiments, rotational means housed in housing 322 rotates the cylindrical target 30 about its longitudinal axis while magnet assembly 80 is held against rotation within the cylindrical target 30. In one embodiment, magnet assembly 80 may remain stationary for a set period of time. A target wear pattern 86 may develop during this time. Target wear pattern 86 may include a relative deeper or wider groove about turnaround 450, which may be detectable by an operator's vision. When the groove exceeds a certain undesirable size, the operator may manipulate knob 432 by pushing or pulling it. This action changes the axial location of magnet assembly 80 relative to the cylindrical target 30, and will dictate a new target wear pattern location, thereby increasing the utilization of cylindrical target 30. The operator may repeat these steps as many times and as frequently as desired. Desirably, the magnet assembly 80 is moved relative to the target 30 in an asynchronous manner.

In some embodiments, the oscillation of magnet assembly 80 within cylindrical target 30 via actuator 430 is automated. For example, a clock mechanism may be used to periodically move the magnet assembly 80 within the target 30. Desirably, the clock mechanism initiates movement of the magnet asynchronously. Perhaps even more desirably, the clock may move the magnet assembly 80 within the target 30 at random intervals. As another example, an automated mechanism may be used to move the magnet 80 substantially continuously within the target 30 as it rotates. Desirably, the rate of linear movement of the magnet assembly 80 is independent of the rotation rate of the target 30 to provide asynchronous movement between the target and the magnet assembly.

While embodiments of the present invention have been described, it should be understood that various changes, adaptations, and modifications may be made therein without departing from the spirit of the invention and the scope of the appended claims.

What is claimed is:

1. A cathode target assembly for use in sputtering target material onto a substrate, comprising:
    a generally cylindrical target, having a longitudinal axis, said target being rotatable around said axis during sputtering operation;
    an elongated magnet supported within said target to generate a plasma-containing magnetic field exterior to but adjacent said target, said magnet being constrained against rotation about said axis within the target; and
    an apparatus to cause oscillatory movement of said magnet parallel to said axis to promote generally uniform target utilization along the length of said target, the apparatus being configured such that an instantaneous longitudinal position of the magnet with respect to the target at any point in the target's rotation varies as the target is rotated through consecutive 360° revolutions, so that no single rotational position of the target corresponds to any single longitudinal position of the magnet in a consecutive manner.

2. The target assembly of claim 1, wherein:
    said apparatus comprises a cam rotatable in response to rotation of the target, and a cam follower coupled to the magnet and engaging the cam to move the magnet axially of the target in response to target rotation.

3. The target assembly of claim 2, wherein:
the cam comprises a generally serpentine pathway, and the cam follower engages the pathway to move the magnet axially of the target in response to target rotation.

4. The target assembly of claim 2, wherein:
the target includes an end section adjacent one end of the target, the end section carrying the cam.

5. The target assembly of claim 2, wherein:
the cam rotates about a second axis.

6. The target assembly of claim 2, wherein:
the cam rotates at a first rotational rate, the target rotates at a second rotational rate, said first rotational rate being different from said second rotational.

7. The target assembly of claim 1, wherein:
the apparatus is responsive to rotation of the target.

8. The target assembly of claim 1, wherein:
the magnet is axially movable a distance of at least one centimeter.

9. The target assembly of claim 1, comprising:
an end block; and
said apparatus is disposed at least partially within the end block.

10. The target assembly of claim 1, wherein:
the apparatus comprises an actuator.

11. A cathode target assembly for use in sputtering target material onto a substrate, comprising:
a generally cylindrical target, said target having a longitudinal axis;
an apparatus to rotate the target about its axis during a sputtering operation;
an elongated magnet supported within the target to generate a plasma-containing magnetic field exterior to but adjacent the target, said magnet being restrained against rotation within the target; and
a power train configured to cause the magnet to longitudinally oscillate within the target such that an instantaneous longitudinal position of the magnet with respect to the target at any point in the target's rotation varies as the target is rotated through consecutive 360° revolutions, so that no single rotational position of the target corresponds to any single longitudinal position of the magnet in a consecutive manner.

12. The target assembly of claim 11, wherein:
the power train comprises a cam, said cam rotating when said target rotates, and a cam follower coupled to the magnet and engaging the cam.

13. The target assembly of claim 12, wherein:
the cam comprises a generally serpentine pathway, and the cam follower comprises a surface engaging the pathway to reciprocate the magnet as the target rotates about its axis.

14. A method for sputtering target material onto a substrate in a magnetron sputtering operation, comprising:
providing a generally cylindrical target having a longitudinal axis;
providing an elongated magnet carried within the target;
utilizing the elongated magnet to generate a plasma-containing magnetic field exterior to but adjacent the target;
rotating the target about the longitudinal axis;
restraining the elongated magnet from rotational movement; and
longitudinally displacing the magnet in an oscillating manner such that an instantaneous longitudinal position of the magnet with respect to the target at any point in the target's rotation varies as the target is rotated through consecutive 360° revolutions, so that no single rotational position of the target corresponds to any single longitudinal position of the magnet in a consecutive manner.

15. The method of claim 14, wherein:
the rotating step and the longitudinally displacing step are performed simultaneously.

16. The method of claim 14, comprising:
oscillating the magnet over a longitudinal distance of at least one centimeter.

17. A cathode target assembly for use in sputtering target material onto a substrate, comprising:
a generally cylindrical target having a longitudinal axis;
means for rotating the target about its axis during a sputtering operation;
an elongated magnet carried within the target for generation of a plasma-containing magnetic field exterior to but adjacent the target;
a framework for supporting the magnet against rotation within the target; and
a power train configured to cause the magnet to oscillate in a direction parallel to the longitudinal axis such that an instantaneous longitudinal position of the magnet with respect to the target at any point in the target's rotation varies as the target is rotated through consecutive 360° revolutions, so that no single rotational position of the target corresponds to any single longitudinal position of the magnet in a consecutive manner.

* * * * *